United States Patent
Horio et al.

(10) Patent No.: US 7,067,733 B2
(45) Date of Patent: Jun. 27, 2006

(54) THERMOELECTRIC MATERIAL HAVING CRYSTAL GRAINS WELL ORIENTED IN CERTAIN DIRECTION AND PROCESS FOR PRODUCING THE SAME

(75) Inventors: Yuma Horio, Shizuoka (JP); Junya Suzuki, Shizuoka (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 10/317,104

(22) Filed: Dec. 12, 2002

(65) Prior Publication Data

US 2003/0131878 A1 Jul. 17, 2003

(30) Foreign Application Priority Data

Dec. 13, 2001 (JP) ............................. 2001-380657

(51) Int. Cl.
*H01L 35/34* (2006.01)
*H01L 35/16* (2006.01)
*H01L 35/18* (2006.01)

(52) U.S. Cl. ...................... 136/201; 136/240; 136/238; 136/205; 136/203; 252/62.3 T; 423/508; 423/509; 257/467; 257/414; 438/54

(58) Field of Classification Search ................ 136/240, 136/238, 205, 203, 201; 252/62.3 T; 423/509, 423/508; 438/54; 257/467, 413, 414
See application file for complete search history.

(56) References Cited

U.S. PATENT DOCUMENTS

| | | | | |
|---|---|---|---|---|
| 5,763,293 A | * | 6/1998 | Yamashita et al. | 438/55 |
| 5,883,563 A | * | 3/1999 | Horio et al. | 338/22 SD |
| 5,981,863 A | * | 11/1999 | Yamashita et al. | 136/201 |
| 6,043,424 A | * | 3/2000 | Horio et al. | 136/236.1 |
| 6,274,022 B1 | * | 8/2001 | Asai et al. | 205/89 |
| 6,274,802 B1 | * | 8/2001 | Fukuda et al. | 136/201 |
| 6,307,143 B1 | * | 10/2001 | Horio et al. | 136/240 |
| 6,313,392 B1 | * | 11/2001 | Sato et al. | 136/201 |
| 6,316,279 B1 | * | 11/2001 | Tauchi et al. | 438/22 |
| 6,319,744 B1 | * | 11/2001 | Hoon et al. | 438/54 |
| 6,399,871 B1 | * | 6/2002 | Sharp | 136/201 |
| 6,617,504 B1 | * | 9/2003 | Kajihara et al. | 136/201 |
| 6,743,973 B1 | * | 6/2004 | Hayashi et al. | 136/201 |
| 2002/0100499 A1 | * | 8/2002 | Hayashi et al. | 136/238 |

FOREIGN PATENT DOCUMENTS

EP 996174 A1 * 4/2000
JP 10-178218 6/1998

(Continued)

OTHER PUBLICATIONS

Partial English translation of Japanese Office Action, date unknown.

*Primary Examiner*—Alan Diamond
(74) *Attorney, Agent, or Firm*—Dickstein, Shapiro, Morin & Oshinsky, LLP.

(57) ABSTRACT

Thermoelectric material is produced through a process sequence including a liquid quenching, a primary solidification such as a hot pressing or extrusion and an upset forging; although the C-planes of the crystal grains are directed in parallel to the direction in which the force is exerted on flakes during the hot pressing/extrusion, the a-axes are randomly directed; the a-axes are oriented in a predetermined direction through the upset forging; this results in improvement of electric resistivity without reduction in the figure of merit.

12 Claims, 14 Drawing Sheets

FOREIGN PATENT DOCUMENTS

| | | |
|---|---|---|
| JP | 10-178219 | 6/1998 |
| JP | 11-163422 A * | 6/1999 |
| JP | 11-261119 | 9/1999 |
| JP | 2000-138399 A * | 5/2000 |
| JP | 2000-277817 A * | 10/2000 |
| JP | 2000-286471 A * | 10/2000 |
| JP | 2001-53344 | 2/2001 |
| JP | 2001-160633 | 6/2001 |

* cited by examiner

DIRECTION of THICKNESS      Fig. 9 A

THERMOELECTRIC MATERIAL HAVING CRYSTAL GRAINS WELL ORIENTED IN CERTAIN DIRECTION AND PROCESS FOR PRODUCING THE SAME

FIELD OF THE INVENTION

This invention relates to thermoelectric material and, more particularly, to thermoelectric material and a process for producing the thermoelectric material.

DESCRIPTION OF THE RELATED ART

There have been known two processes for producing the thermoelectric material. The first process is illustrated in FIGS. 1A to 1C, and is hereinbelow referred to as "unidirectional solidification process". The second process is called as "sintering process". Description is firstly made on these two prior art processes.

The prior art unidirectional solidification process starts with preparation of pellets 1 of raw material. The pellets 1 are put in a quartz cylinder, and are accumulated in one end portion of the quartz cylinder. Heat is applied to the other end portion 2a of the quartz cylinder. The other end portion 2a is melted, and is closed. The melted quartz is solidified so that the pellets 1 are sealed in the quartz capsule 2 as shown in FIG. 1A.

Subsequently, the quartz capsule 2 is inserted into a tube furnace 3, and is fixed thereto. The tube furnace 3 has been already rotatably supported by a stand 4. The quartz capsule 2 is heated by the tube furnace 3, and the pellets 1 are fused. The quartz capsule 2 is rolled as indicated by arrows 5 in FIG. 1B so that the fused material 1a is churned in the quartz capsule 2. The tube furnace 3 continues the rolling for a certain time, and the fused material 1a is well churned in the quartz capsule 2.

The tube furnace 3 stops the rolling, and keeps the quartz capsule 2 vertical as shown in FIG. 1C. The tube furnace 3 creates a certain temperature gradient in the quartz capsule 2, and makes the fused material 1a solidified. While the material is being solidified in the quartz capsule 2, the crystal is oriented in a certain direction. Thus, the solidified material exhibits the certain crystal orientation.

The crystal grains were equal in diameter to or greater than several millimeters. Moreover, the solidified material was cleavable. The solidified material exhibited high thermal conductivity.

A typical example of the prior art sintering process is disclosed in Japanese Patent Application laid-open No. 2000-232243. The prior art sintering process starts with preparation of powder of raw material. A cavity of a die unit 11 is filled with the powder of raw material, and the powder of raw material is hot pressed as shown in FIG. 2. While the powder of raw material is being hot pressed, the applied force promotes the growth in a direction perpendicular to the direction of the applied force, and the crystal grains 12 are grown in such a manner that a-axes 13 and c-axes 14 extend perpendicularly to the direction of hot pressing and in parallel to the direction of hot pressing, respectively. The crystal grains 12 are equal in diameter to or greater than several millimeters, and the aspect ratio is equal to or greater than 5. Thus, the powder of raw material is sintered, and thermoelectric material is obtained. Anisotropic crystal structure is required for the thermoelectric material, and the prior art sintering process is preferable for producing the thermoelectric material.

The sintered product is cut, and electrodes are formed on the pieces of thermoelectric material. The electrodes on each piece are spaced in the direction parallel to the a-axis 13.

The crystal structure of the thermoelectric material is illustrated in FIG. 3, and is categorized in the hexagonal system. C-plane is indicative of hatching lines. The crystal grains of the sintered product were as large as the particles of the powder.

Other prior art processes are disclosed in Japanese Patent Application laid-open Nos. hei 10-178218, hei 10-178219 and hei 11-261119. The prior art processes disclosed therein include steps of pulverizing an ingot, sintering the powder and forging the sintered product. These are hereinbelow referred to as "upset forging process".

A problem inherent in the thermoelectric material produced through the prior art unidirectional solidification process is brittleness. As described in connection with the prior art unidirectional solidification process, the solidified thermoelectric material has cleavage planes, and, accordingly, is liable to be cleaved when mechanical impact is exerted thereon.

Another problem is a low figure of merit. The figure of merit Z is given as $$Z = \alpha^2 / (\rho \times \kappa)$$

where $\alpha$ is Zeebeck coefficient, i.e., ($\mu \cdot V/K°$), $\rho$ is the electric resistivity, i.e., ($\Omega m$) and $\kappa$ is the heat conductivity, i.e., ($W/m \cdot K°$). The larger the heat conductivity $\kappa$, the smaller the figure of merit Z, because the heat conductivity $\kappa$ is put in the demoninator.

When crystal grains are enlarged, the heat conductivity $\kappa$ is increased, and the electric resistivity $\rho$ is decreased. On the contrary, the heat conductivity $\kappa$ is reduced together with the grain size, and the electric resistivity $\rho$ is increased inversely to the grain size. The thermoelectric material produced through the prior art unidirectional solidification process contained the large grains of the order of several millimeters. This results in the small figure of merit.

A problem inherent in the thermoelectric material obtained through the prior art sintering process is also small figure of merit. As described herein-before, the grains of the thermoelectric material are as large as the particles of the powder. Although the grain size has the influences on both of the heat conductivity $\kappa$ and the electric resistivity $\rho$, the influence on the heat conductivity $\kappa$ is stronger than the influence on the electric resistivity $\rho$. Fine powder is preferable for the thermoelectric material. However, the fine powder has reached the limit. This means that the manufacturers can not rely on little prospect of powder finer than now. Another cause of the small figure of merit is oxidation of the powder particles. It is impossible to perfectly prevent the powder particles from the oxidation. The oxide makes the electric resistivity $\rho$ increased and, accordingly, the figure of merit decreased. Thus, the small figure of merit is also the serious problem in the thermoelectric material produced through the prior art sintering process.

A problem inherent in the thermoelectric material produced through the prior art upset forging processes is also a small figure of merit. The reason for the small figure of merit is poor orientation in the thermoelectric material. In the prior art upset forging processes, the ingots are pulverized, and the powder is sintered without any treatment. The powder particles are randomly oriented so that the sintered product does not have a clearly oriented crystal structure. This results in the small figure of merit.

A countermeasure is proposed in Japanese Patent Application laid-open No. 10-178219. The crystal grains of the thermoelectric material have cleavage planes, and are liable to glide along particular glide planes. Although it is proposed to enhance the crystal orientation by virtue of the cleavage planes and glide planes in the Japanese Patent Application laid-open, the strain is increased through the prior art countermeasure. This results in reduction of the heat conductivity κ, and the electric resistivity ρ is increased. The figure of merit is still small in value. It is possible to cure the strain through an annealing and a high-temperature shaping process. However, the crystal grains are randomly grown so that the crystal becomes much poorer than the crystal before the annealing/high-temperature shaping process. Thus, the counter-measure proposed in Japanese Patent Application laid-open No. 10-178219 is less effective against the small figure of merit.

Another countermeasure is disclosed in Japanese Patent Application laid-open 2000-232243. The prior art thermoelectric material disclosed therein exhibits a large figure of merit. However, the prior art thermoelectric material is large in electric resistivity ρ. The electric resistivity ρ is sensitive to heat, and, for this reason, the users hesitate to use the prior art thermoelectric material in high-temperature ambiences. A user is assumed to put the prior art thermoelectric material in a relatively high-temperature ambience. The prior art thermoelectric material increases the electric resistivity ρ by a value corresponding to the difference between the room temperature and the relatively high-temperature ambience. The prior art thermoelectric material slightly raises the temperature due to the Joule heat, and the electric resistivity ρ is further increased. Thus, the feed-forward loop is established in the prior art thermoelectric material, and sets a limit to the environment in which the prior art thermoelectric material operates.

The prior art thermoelectric material is available for Peltier refrigerators. The manufacturers usually set limits on the amount of electric current consumed by their refrigerators. While the electric current is flowing through the Peltier elements, the temperature rises at the hot side, and the electric resistivity ρ is increased. The amount of electric current flowing through the Peltier elements is getting smaller and smaller. This results in that the heat source raises the temperature. If the user prevents the heat source from high-temperature ambience, the Peltier refrigerator requires electric current more than the limit value. For this reason, the manufacturer does not recommend the prior art thermoelectric material in the high-temperature ambience over 90 degrees in centigrade.

SUMMARY OF THE INVENTION

It is therefore an important object of the present invention to provide thermoelectric material, which exhibits a large figure of merit in high-temperature ambience without increase of electric power consumption.

It is also an important object of the present invention to provide a process for producing the thermoelectric material.

To accomplish the objects of the present invention, it is proposed stepwise to orient C-planes in a certain direction.

In accordance with one aspect of the present invention, there is provided a thermoelectric material containing at least one first element selected from the group consisting of Bi and Sb and at least one second element selected from the group consisting of Te and Se and incidental impurities and including crystal grains having having C-planes inclining with respect to a certain direction at 45 degrees or less, the crystal grains occupies an area of a surface of the thermoelectric material in parallel to the certain direction, and the ratio of the area to the entire area of the surface is equal to or greater than 90%.

In accordance with another aspect of the present invention, there is provided a process for producing thermoelectric material comprising the steps of a) preparing a liquid raw material for the thermoelectric material, b) quenching the liquid raw material for producing flakes containing crystal grains, c) orienting C-planes of the crystal grains in parallel to a certain direction through a primary solidification, d) orienting a-axes on the C-planes of a crystal structure in a hexagonal system in parallel to a target direction perpendicular to the certain direction for producing the thermoelectric material, and e) forming electrodes on a piece of the thermoelectric material in such a manner that the electrodes are spaced from one another in the target direction.

BRIEF DESCRIPTION OF THE DRAWINGS

The features and advantages of the thermoelectric material and the process will be more clearly understood from the following description taken in conjunction with the accompanying drawings, in which.

DESCRIPTION OF THE PREFERRED EMBODIMENT

Process Sequence

Figure 1:
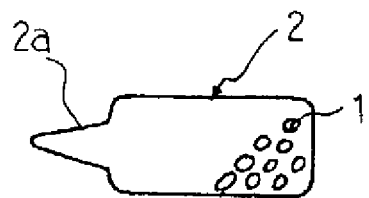
FIGS. 1A to 1C are schematic views showing the prior art unidirectional solidification process.
Figure 1:
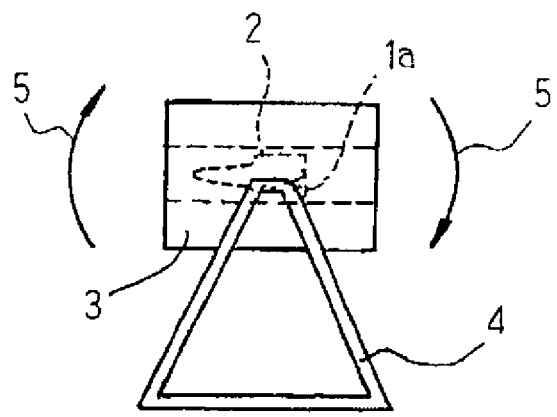
Figure 1:
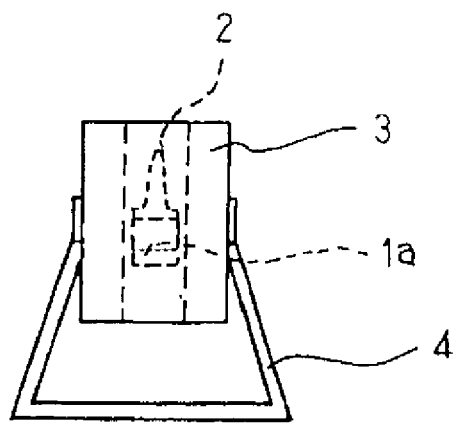
Figure 2:
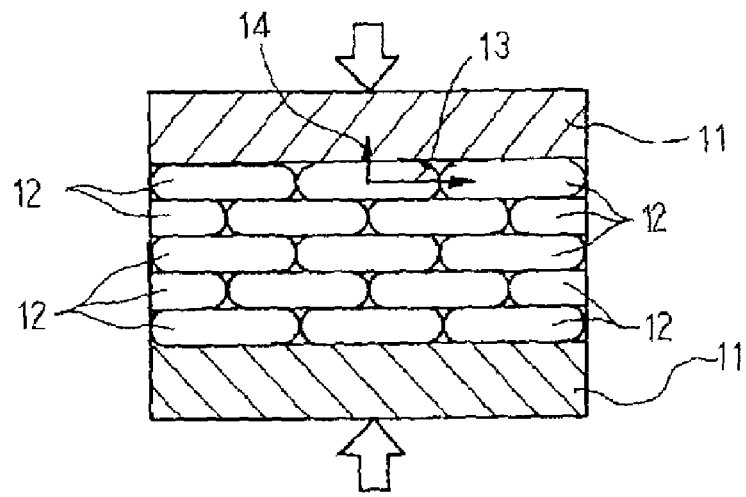
FIG. 2 is a schematic cross sectional view showing the thermoelectric material produced through the prior art sintering process.
Figure 3:
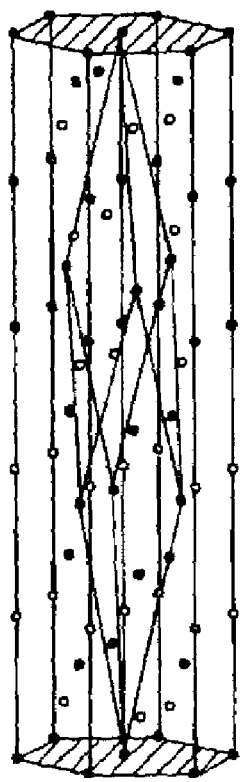
FIG. 3 is a perspective view showing the crystal structure of the thermoelectric material.
Figure 4:
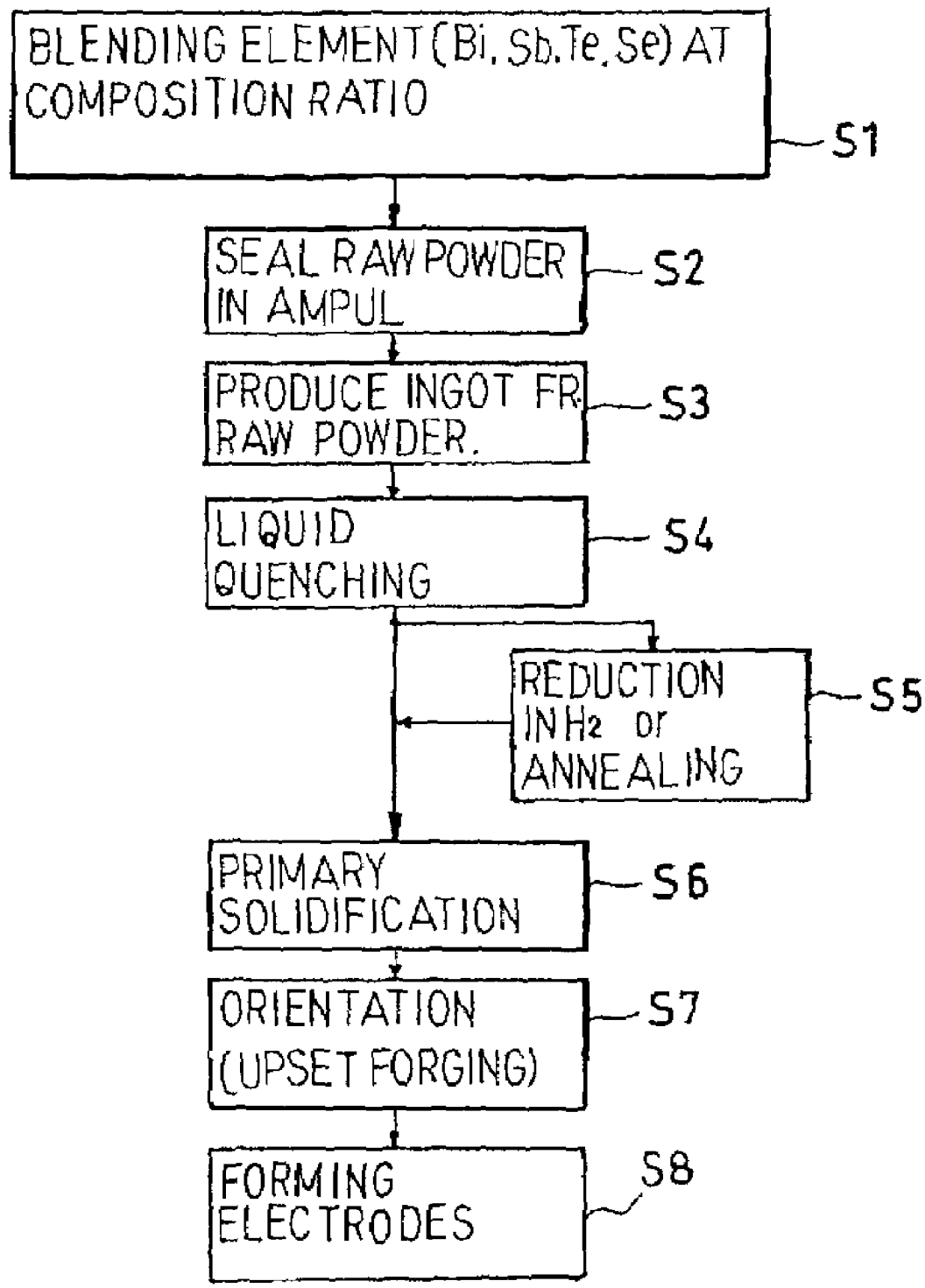
FIG. 4 is a flowchart showing a process for producing thermoelectric material according to the present invention.

FIG. 4 shows a process sequence for producing thermoelectric material embodying the present invention. The process includes seven steps S1 to S7. The process starts with blending constituent elements of the thermoelectric material at a predetermined composition ratio as by step S1. The constituent elements are scaled, and, thereafter, are mixed with one another. The constituent elements are dependent on the composition of the thermoelectric material. In case where the thermoelectric material is in the bismuth-antimony-tellurium-selenium system, i.e., Bi—Sb—Te—Se system, the bismuth, antimony, tellurium and selenium are the constituent elements. The mixture of the constituent elements is hereinbelow referred to as "pellets".

Subsequently, the pellets are sealed in an ampul as by step S2. The pellets are heated over the melting point, and an ingot is produced from the pellets in the ampul as by step S3. The ingot is taken out from the ampul. The ingot is melted, and the molten alloy is solidified through a liquid quenching technique as by step S4. Powder and/or flakes are obtained through the liquid quenching. The flakes produced through the liquid quenching contain crystal grains, and the crystal grains have a crystal structure in the hexagonal system. C-planes of the crystal structure are directed in parallel to the direction of the thickness of the flakes. The flakes are pulverized so that small flakelets are obtained. Distortions and crystal defects are introduced at high density in the flakes through the liquid quenching.

While the molten alloy is being solidified through the liquid quenching, chilled grains are possibly produced. In case where a non-ignoreable amount of chilled grains are forecasted, the flakelets are subjected to a reduction in hydrogen or annealing in inert atmosphere as by step S5. The chilled grains are cured through the reduction in hydrogen or annealing. The chilled grains are recrystallized during the reduction in hydrogen or annealing in inert atmosphere, and the distortions and crystal defects serve as cores in the recrystallization. Thus, the chilled grains are cured, and fine crystal grains are precipitated in the flakes. However, if the chilled grains are ignoreable, the flakes are solidified without step S5.

Subsequently, the flakelets are solidified as by step S6. The solidification is hereinbelow referred to as "primary solidification". A hot pressing may be used for the primary solidification. An extrusion is available for the primary solidification. Even though the reduction in hydrogen or annealing in inert atmosphere is not carried out, the distortions and crystal defects also serve as cores in the primary solidification, and the chilled grains are fairly cured through the hot pressing or extrusion. This results in fine crystal grains precipitated in the flakelets. The grain boundaries of the fine crystal grains are lower in impurity concentration than the boundaries among the flakelets so that the heat conductivity κ is reduced by virtue of the increased lattice-scattering at the grain boundaries without increase of the electric resistivity ρ in resultant material produced from the flakelets. This results in enhancement of the figure of merit Z.

The crystal grains are appropriately oriented in the primary solidification through the hot pressing or extrusion by virtue of the recrystallization at the distortions and crystal defects serving as the cores. The major axes of the crystal grains are oriented in parallel to the direction of the force exerted on the crystal grains, and the minor axes are oriented in the direction perpendicular to the direction of the force. Thus, the crystal grains with large aspect ratio are grown or recrystallized in the primary solidification. The electric resistivity ρ is much lower in the direction of the major axes than in the direction of the minor axes so that the resultant material exhibits a large figure of merit in the direction of the major axes. Moreover, the C-planes or a-axes are to be directed in parallel to the direction in which the force is exerted on the flakelets. This results in a low electric resistivity ρ and, accordingly, a large figure of merit Z. A sintered product is obtained through the primary solidification. When electrodes are formed on a piece of thermoelectric material, the electrodes are to be spaced from each other in the direction parallel to the direction of the force, i.e., the direction of the major axes.

Subsequently, the solid body is subjected to an upset forging as by step S7. The sintered product is adapted to protrude in a direction normal to a virtual plane defined by the direction of force in the primary solidification and a direction of force exerted on the solid body in the upset forging. The a-axes of the crystal grains are directed in parallel to the direction in which the solid body protrudes. Thus, thermoelectric material according to the present invention is obtained through the upset forging. Since thermoelectric material exhibits a low resistivity ρ the direction of a-axes, a large figure of merit Z is achieved.

Finally, electrodes are formed on a piece of thermoelectric material as by step S8. The electrodes are to be spaced in the direction of a-axes so that electric current flows in the direction of a-axes against low resistance.

The steps S1 to S8 will be hereinafter described in more detail. The following concrete operations in each step S1 to S7 are an example of the corresponding part of the process sequence.

Pellets

In the process shown in FIG. 4, the thermoelectric material is the Bi—Sb—Te—Se system. However, the thermoelectric material according to the present invention may contain at least one element selected from the group consisting of Bi and Sb and at least one element selected from the group consisting of Te and Se. In other words, the thermoelectric material according to the present invention contains one of or both of Bi and Sb and one of or both of Te and Se. Moreover, the thermoelectric material according to the present invention may further contain at least one element selected from the group consisting of I, Cl, Hg, Br, Ag and Cu.

Ingot

Figure 5:
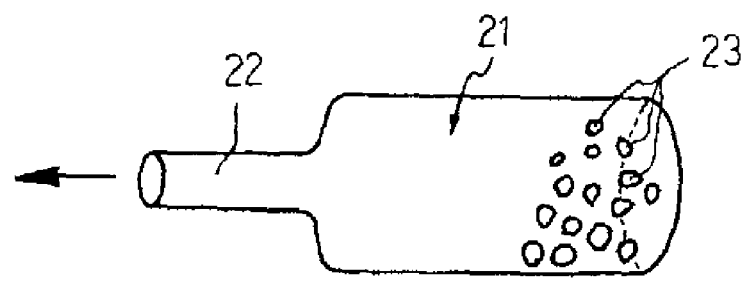
FIGS. 5A to 5C are schematic views showing a step for producing an ingot.
Figure 5:
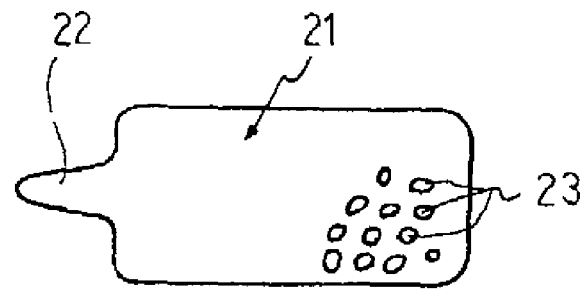
Figure 5:
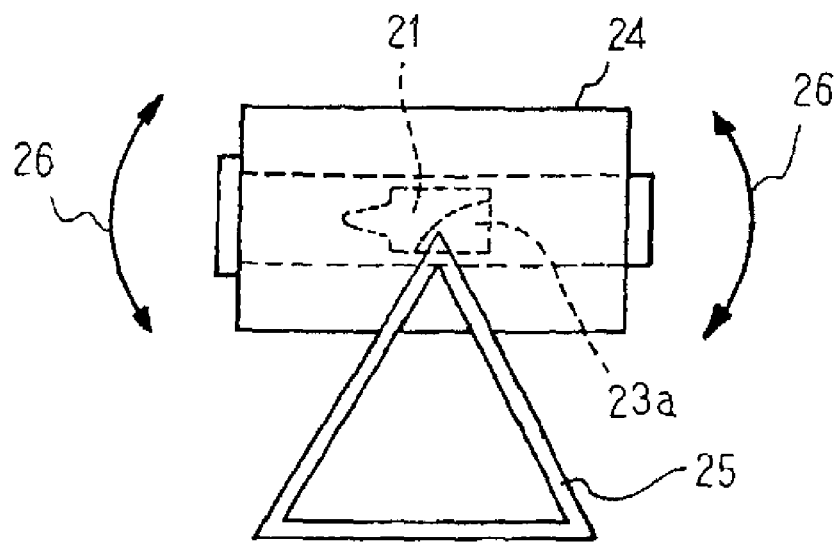

The ingot is produced in an ampul as shown in FIGS. 5A to 5C. An ampul 21 of quartz is prepared. The ampul 21 is like a bottle, and has a throat 22. The pellets 23 are put in the ampul 21 through the throat 22. Vacuum is developed in the ampul 21 as shown in FIG. 5A. After the development of vacuum, inert gas may be injected into the ampul 21. However, the inert gas is not indispensable feature of the process. In case where the inert gas is not injected, the pellets 23 are in the vacuum created in the ampul 21.

Subsequently, the throat 22 is heated over the softening temperature of quartz. Then, the quartz is softened, and flows into the narrow passage in the throat 22. The narrow passage is clogged with the melted quartz. After cooling down, the throat 22 is cut off in such a manner that the pellets 23 are sealed in the ampul 21 as shown in FIG. 5B.

A tube furnace 24 is coupled with a rolling mechanism (not shown), which in turn is supported by a stand 25. The ampul 21 is inserted in the tube furnace 24, and is heated over the melting point, and the tube furnace 24 keeps the ampul 21 between 600 degrees and 700 degrees in centigrade. The rolling mechanism gives rise to rolling motion 26 of the tube furnace 24 so that the melted alloy 23a is agitated in the ampul 21 as shown in FIG. 5C.

The tube furnace 24 is cooled, and the melted alloy 23a is solidified. The solid alloy, i.e., ingot is taken out from the ampul 21.

Liquid Quenching

Figure 6:
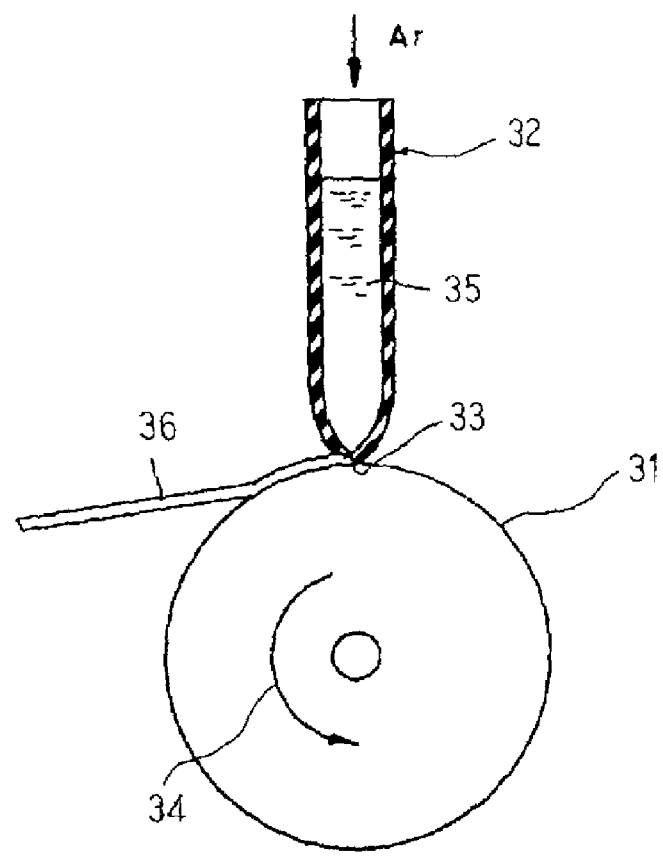
FIG. 6 is a schematic view showing a facility for liquid quenching.

FIG. 6 shows a facility for the liquid quenching. A roller 31 of copper is coupled to a driving mechanism (not shown), and a quartz nozzle 32 is provided over the roller 31. A slit or plural holes 33 are formed in the lower end of the quartz nozzle 32, and are confronted to the outer surface of the roller 31. The quartz nozzle 32 is provided with a heater (not shown), and a source of high-pressure argon gas Ar is connected to the quartz nozzle 32.

The ingot is put in the quartz nozzle 32, and is heated over the melting point. The roller 31 is maintained at room temperature. The roller 31 is driven for rotation as indicated by arrow 34, and the high-pressure argon gas Ar is introduced into the quartz nozzle 32. The melted alloy 35 is pressurized in the quartz nozzle 32, and is poured onto the outer surface of the copper roller 31. When the melted alloy 35 reaches the copper roller 31, the melted alloy 35 rapidly loses the heat, and is solidified in the form of thin layer 36. The thin layer 36 of alloy is rotated together with the copper roller 31, and are separated from the outer surface of the roller 31 as shown. The thin layer 36 may be broken into flakes 36 on the roller 31 or at the separation from the roller 31.

Figure 7:
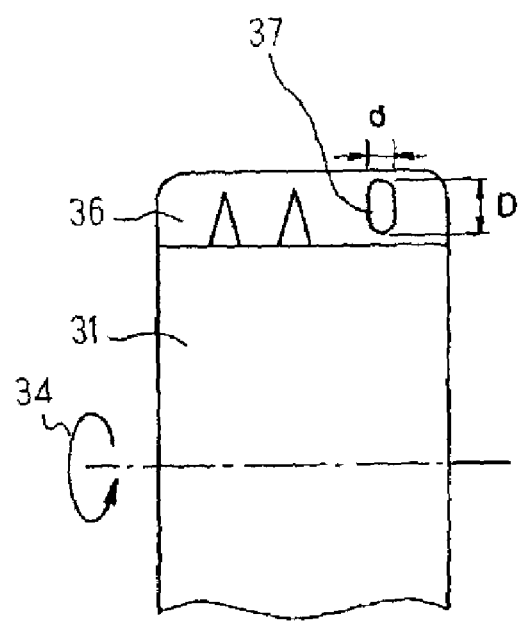
FIG. 7 is a schematic view showing alloy grown through the liquid quenching.

FIG. 7 shows the thin layer 36 grown on the outer surface of the copper roller 31. The thin layer 36 contains a lot of crystal grains 37, and an ellipse stands for one of the crystal grains 37. The crystal grains 37 have respective major axes D and respective minor axes d. The major axes D are longer than the minor axes d. Most of the major axes D are directed in respective directions parallel to the radial direction of the copper roller 31. In other words, most of the major axes D are directed in the direction of the thickness of the thin layer 36. On the other hand, the minor axes are directed in parallel to the outer surface of the roller 31. This is because of the following facts. When the melted alloy 35 is brought into contact with the outer surface of the copper roller 31, the melted alloy 35 rapidly loses the heat, and is solidified as described hereinbefore. The melted alloy continuously reaches the layer of the solidified alloy, and also loses the heat so as to be solidified on the layer of solidified alloy. This means that temperature gradient takes place in the layer of solidified alloy. The temperature is the lowest at the boundary between the outer surface of the roller 31 and the layer of the solidified alloy, and is increased toward the uppermost surface just solidified. The crystal grains 37 are grown in the direction of the thickness of the layer of solidified alloy, i.e., the flakes 36, and the major axes D are directed to the directions parallel to the radial direction of the roller 31. Thus, most of the crystal grains 37, which have been grown in the directions parallel to the radial direction, have a large aspect ratio. For this reason, the flakes 36 exhibits low resistivity in the direction of the thickness thereof.

The crystal grains 37 have a crystal structure in the hexagonal system, i.e., hexagonal crystal structure, and the major axis D is in parallel to the C-plane of the hexagonal crystal structure and, accordingly, a-axis. The hexagonal crystal structure, the C-plane of which is directed in parallel to the direction of thickness, is achieved through an appropriate temperature control in the liquid quenching. The present inventors found that the C-planes were directed in parallel to the direction of thickness under the condition that the melted alloy in the quartz nozzle 32 ranges from 650 degrees to 900 degrees in centigrade. A thermocouple was provided in the quartz nozzle 32, and an electric signal representative of the detected temperature was fed back to a high-frequency heating unit for melting the alloy.

Figure 8:
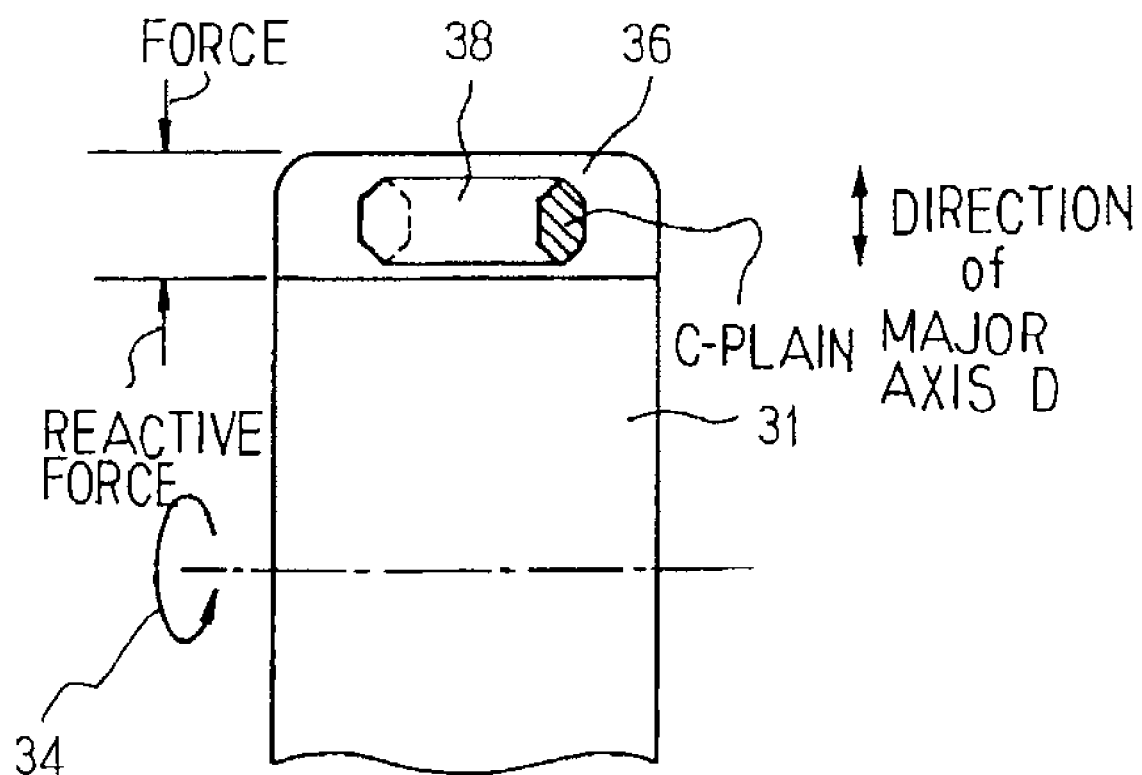
FIG. 8 is a schematic view showing the relation between the crystal structure in powder particles and force exerted on the powder particles during the primary solidification.

As will be described hereinafter in detail, the flakes 36 are pulverized into flakelets, and force is exerted on the flakelets in the primary solidification. FIG. 8 shows the relation between the force to be exerted on the flakelets and the crystal structure in the crystal grains 37. The crystal grains 37 have the hexagonal crystal structure 38, and the force is exerted on the flakelets in such a manner as to be in parallel to the C-plane.

Reduction in Hydrogen/Annealing

It is preferable to carry out the reduction or annealing between the liquid quenching and the primary solidification. The reduction is carried out in hydrogen, and the annealing is carried out in inert gas such as argon. The reduction in hydrogen is, by way of example, carried out at 250 degrees to 500 degrees in centigrade for 5 hours to 12 hours. The partial pressure of hydrogen ranges from 0.05 MP to 0.10 MPa. On the other hand, the annealing in argon atmosphere is carried out at 300 degrees to 500 degrees in centigrade for 5 hours to 12 hours. The partial pressure of argon ranges from 0.05 MPa to 0.08 MPa. The reduction in hydrogen or annealing in argon atmosphere may be carried out at 400 degrees in centigrade for 8 hours. Although the following effect is achieved through the reduction in hydrogen and annealing in argon, the reduction in hydrogen is more preferable, because the carrier mobility is increased by virtue of the reduction of the oxide on the surfaces of the flakes.

Figure 9:
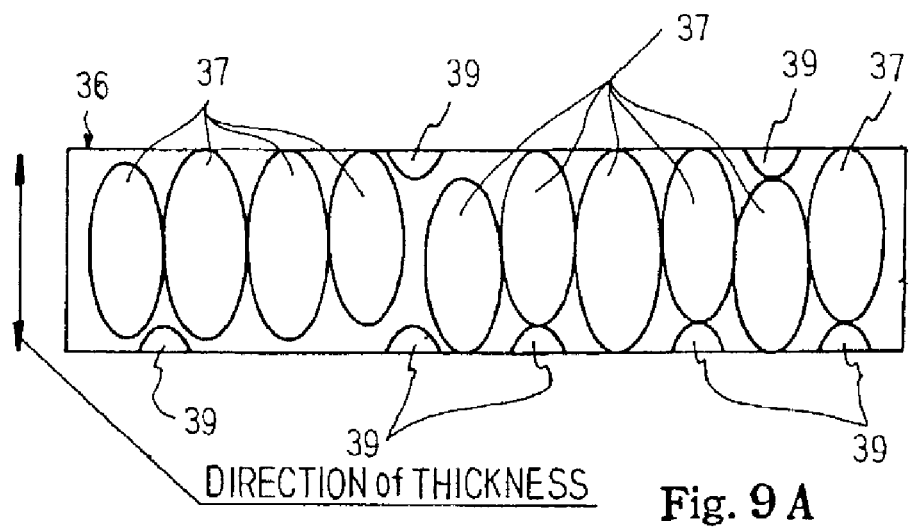
FIGS. 9A and 9B are schematic view showing the crystal structure in a flake before and after a reduction in hydrogen or an annealing in argon.
Figure 9:
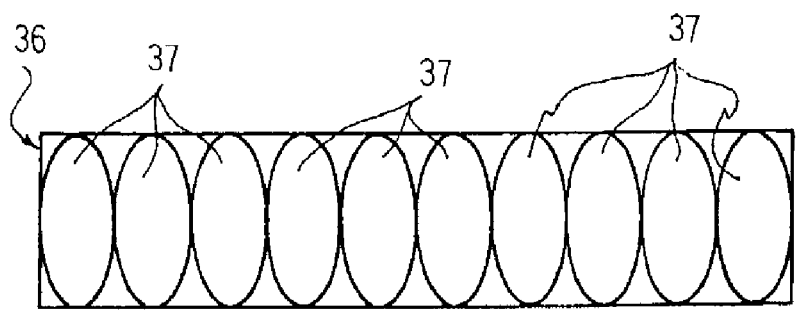

FIGS. 9A shows the crystal structure of the flake 36 before the reduction in hydrogen or annealing in argon atmosphere. The crystal grains 37 form the flake 36, and most of the crystal grains 37 have the major axes D directed in parallel to the direction of the thickness of the flake 36. Chilled grains 39 are seen in the surface portions of the flake 36. However, the chilled grains 39 are extinguished through the reduction in hydrogen or annealing in argon atmosphere. FIG. 9B shows the crystal structure of the flake 36 after the reduction in hydrogen or annealing in argon atmosphere. The chilled grains 39 are not found in the flakes 36, and the crystal grains 37 form the flake 36.

The chilled grains 39 are causative of low mechanical strength of a sintered product, poor orientation of crystal grains and poor sinterability. In case where the flakes are sintered through the hot pressing after the reduction in hydrogen or annealing in inert atmosphere, the flakes are well sintered, the sintered product is large in mechanical strength, and the crystal grains are well oriented in a predetermined direction. The well oriented crystal grains permit the thermoelectric material to exhibit a low resistivity in the predetermined direction so that the figure of merit is enhanced.

In case where the flakes contain a large amount of chilled grains, the chilled grains are randomly grown in the hot pressing, and the large amount of chilled grains make the dominant orientation vague. The chilled grains exert flow stress against the sintering on the flakes so that the sintered product is poor. The reduction in hydrogen or annealing in inert atmosphere prevents the flakes from these undesirable phenomena.

Another advantage obtained through the reduction in hydrogen or annealing in argon atmosphere is segregation of Te atoms and Se atoms in the surface portions of the flakes 36. While the flakes 36 are being reduced in hydrogen or annealed in argon atmosphere, Te atoms and Se atoms are diffused through the grain boundaries, and are segregated in the surfaces of the flakes 36. The segregated Te atoms and Se atoms are improved in the sinterability of the powder, and enhance the carrier mobility of the sintered product.

Primary Solidification

Figure 10:
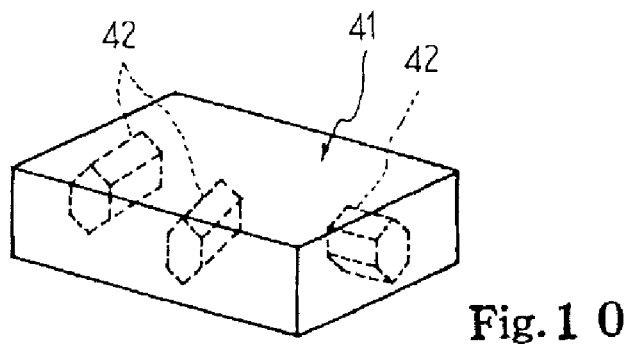
FIG. 10 is a schematic perspective view showing the hexagonal crystal structure in crystal grains of a powder particle.
Figure 11:
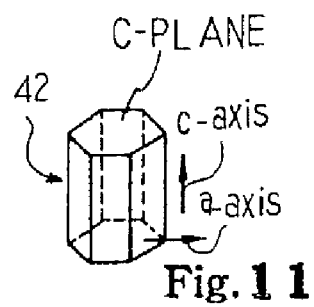
FIG. 11 is a schematic perspective view showing the hexagonal crystal structure.

The flakes 36 are pulverized into flakelets, and the resultant flakelets or pulverized flakes are classified into groups depending upon the size. Certain flakes 36 may be not so large that the manufacturer can put these flakes 36 into a die unit for the hot pressing without pulverization. It is preferable to use the size between 0.1 millimeter to 2 millimeters in diameter. FIG. 10 shows one of the flakelets 41, and the flakelet 41 contains crystal grains, the hexagonal crystal structures 42 of which are oriented in such a manner that the C-planes are in parallel to the direction of the thickness of the flakelet 41. In the hexagonal crystal structure 42, c-axis is normal to the C-plane, and a-axis is in parallel to the C-plane as shown in FIG. 11. For this reason, the a-axes are in parallel to the direction of the thickness of the flakelet 41.

The hot pressing is carried out as follows. First, a die unit is prepared. The die unit is formed with a rectangular parallelepiped space, and force is to be exerted in the direction of depth of the rectangular parallelepiped space. The flakelets 41 are laminated in such a manner as to keep the a-axes of the crystal grains parallel to the direction in which force is to be exerted on the laminated flakes 36 and flakelets 41. The flakes 36 and flakelets 41 have respective values of major surface area much greater than values of thickness. When the flakes 36 and flakelets 41 are put into the rectangular parallelepiped space, it is impossible to stand without making the major surfaces in contact with the bottom surface of the die unit. This means that the flakes 36 or flakelets 41 are laminated on one another, and the flakes 36 and flakelets 41 keep the a-axes parallel to the direction of the depth, i.e., the direction in which the force is to be exerted on the flakes 36 and flakelets 41.

The flakes 36 and flakelets 41 are confined in the die unit. The hot pressing is carried out under the following conditions. For n-type thermoelectric material, the temperature ranges from 250 degrees to 550 degrees in centigrade, the pressure ranges from 0.5 ton/cm² to 1.5 tons/cm², and the hot pressing is continued for 0.5 hour to 2.0 hours. For p-type thermoelectric material, the temperature ranges from 200 degrees to 500 degrees in centigrade, the pressure ranges from 0.5 ton/cm² to 1.5 tons/cm², and the hot pressing is continued for 0.5 hour to 2.0 hours.

The pressure is exerted on the flakes 36 and flakelets 41 in the direction parallel to the a-axes. Most of the crystal grains in the resultant sintered product have the major axes D in parallel to the direction in which the force was exerted on the flakes 41 and the minor axes d perpendicular to the direction of the force. The resultant sintered product has the rectangular parallelepiped shape.

While the flakes 36 and flakelets 41 are being pressed at high temperature in the die unit, the crystal grains 37 are grown and/or recrystallized. The distortions and crystal defects have been already introduced into the flakes 36 and flakelets 41. The distortions and crystal defects serve as the cores in the recrystallization. Since the recrystallized grains have the major axes extending in the direction parallel to the direction in which the force is exerted on the flakes 36 and flakelets 41, they have a large aspect ratio. This results in a large figure of merit. Thus, the flakes 36 and flakelets 41 are preferable for the large figure of merit, because the orientation of the crystal grains is well controlled through the hot pressing.

In case where the flakes 36 have been subjected to the reduction in hydrogen or annealing in the inert atmosphere, the segregated Te and Se tend to be diffused over the flakes 36 and flakelets 41 during the hot pressing. The flakes 36 and flakelets 41 are well sintered in the hot pressing by virtue of the Te and Se, and the Te and Se enhances the mobility of carriers in the sintered product.

Upset Forging

Figure 12:
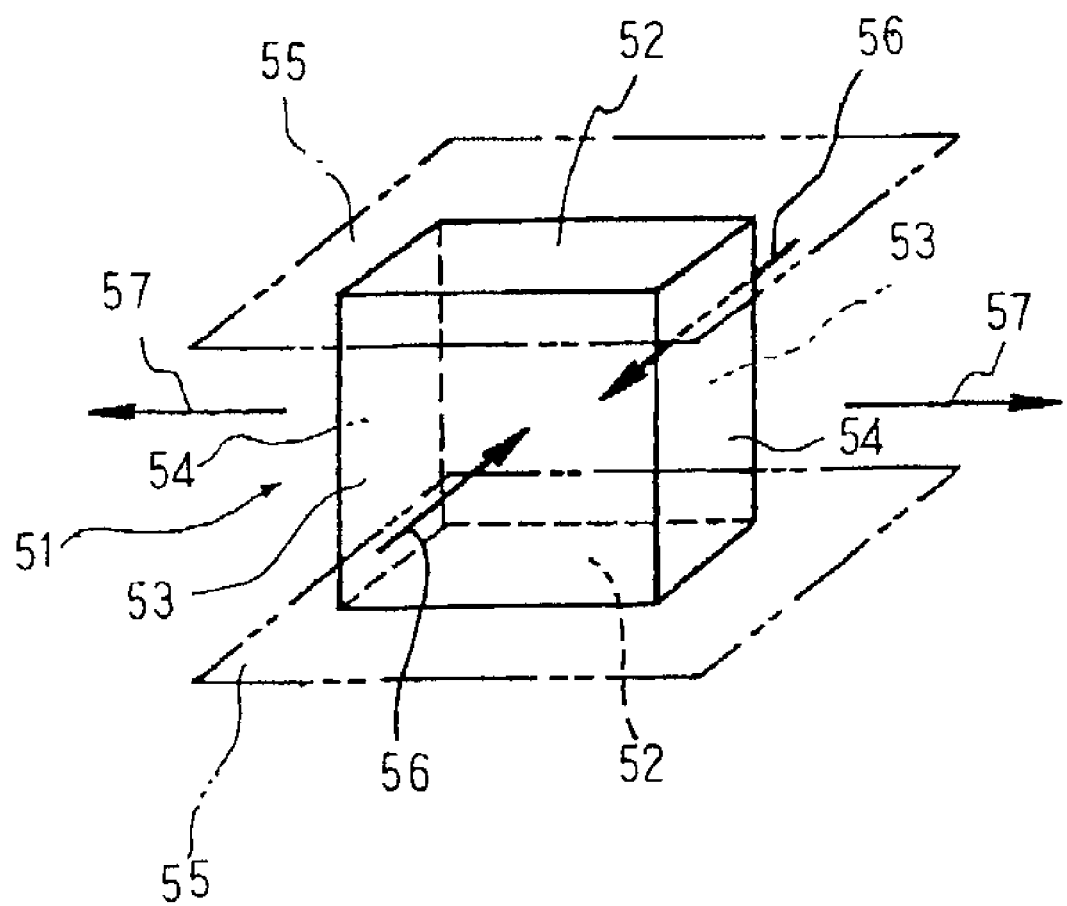
FIG. 12 is a schematic perspective view showing a sintered product in an upset forging step.

FIG. 12 shows the sintered product 51 in the upset forging. In this instance, the sintered product 51 has the rectangular parallelepiped configuration and, accordingly, six surfaces 52/53/54. The force was exerted on the surfaces 52 in the hot pressing. In the upset forging, the surfaces 52 are held in contact with dies 55, and the sintered product 51 can not expand in the direction normal to the surfaces 52. Force is exerted on the surfaces 53 as indicated by arrows 56. As a result, the surfaces 54 protrude, and the sintered product 51 expands in a direction indicated by arrow 57.

Figure 16A:
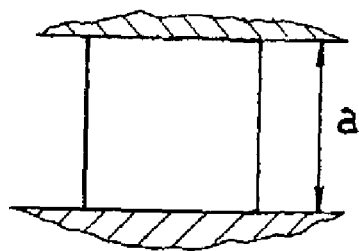
FIGS. 16A and 16B are schematic plane views showing the thickness of the sintered product before and after the upset forging.
Figure 16B:
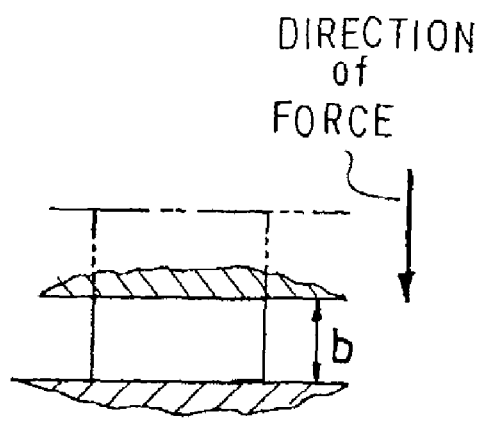

The upset forging is carried out under the following conditions. It is preferable that the atmosphere, in which the upset forging is carried out, is equal in oxygen concentration to or less than 5000 ppm. The atmosphere is to be dry. It is preferable that the atmosphere has the dew point equal to or less than –20 degrees in centigrade. The preferable range of temperature is between 300 degrees to 550 degrees in centigrade, the force to be exerted on the flakes 36 and flakelets 41 are fallen within the range from 0.5 ton/cm² to 1.5 tons/cm². The force is exerted on the flakes 36 and flakelets 41 for 1.0 hour to 6.0 hours. Variance V is expressed as $$V = b/a \times 100$$

where a is a length before the upset forging and b is a length after the upset forging as shown in FIGS. 16A and 16B. The variance V is to be fallen within the range between 50% and 90%.

Figure 13A:
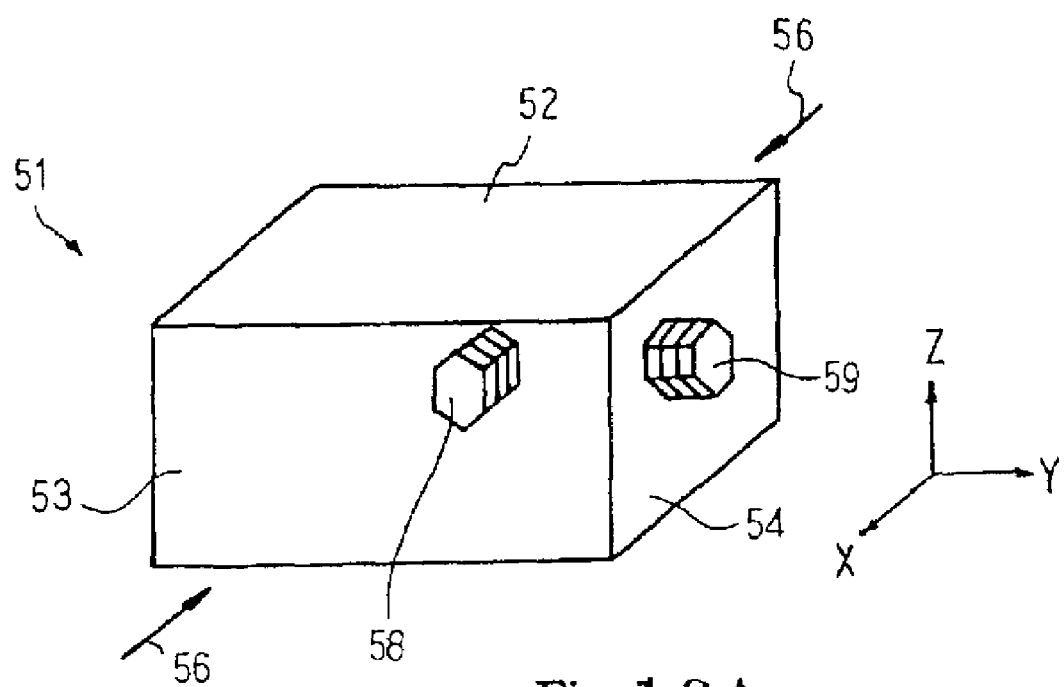
FIGS. 13A, 13B and 13C are schematic perspective views showing the grains of the sintered product before and after an upset forging.
Figure 14:
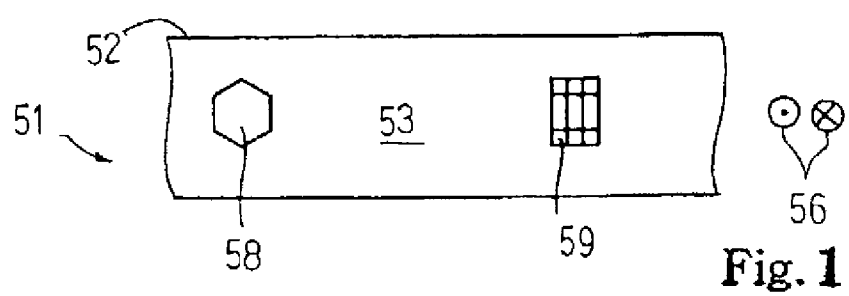
FIGS. 14A, 14B and 14C are schematic front views showing the grains of the sintered product before and after the upset forging.
Figure 14:
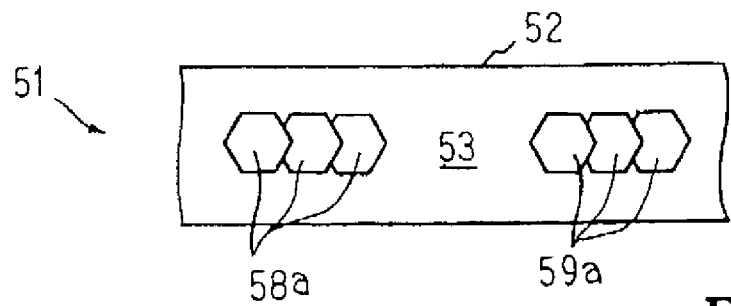
Figure 15:
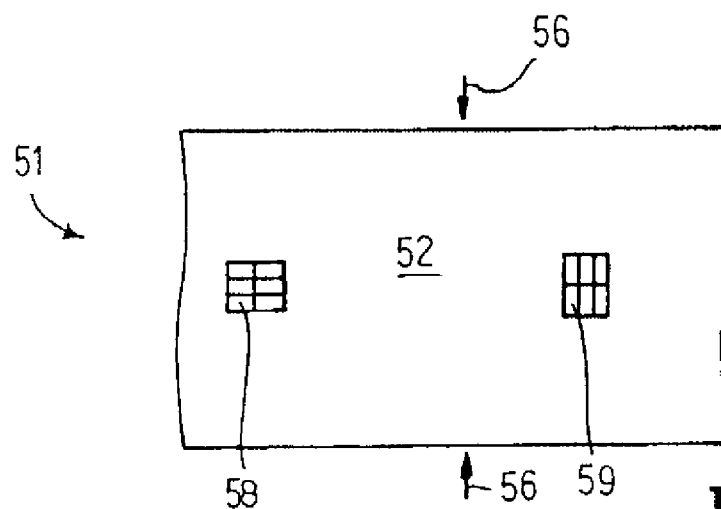
FIGS. 15A, 15B and 15C are schematic plane views showing the grains of the sintered product before and after the upset forging.
Figure 15:
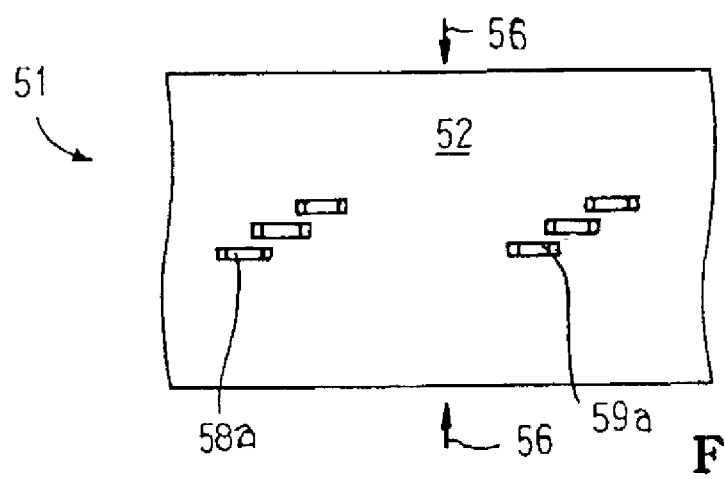

The sintered product 51 contains crystal grains 58/59 before the upset forging as shown in FIGS. 13A, 14A and 15A. The arrow 56 is in parallel to X-axis, and the arrow 57 is in parallel to Y-axis. The grain 58 has the hexagonal crystal structure, the C-plane of which is substantially parallel to the surfaces 53. On the other hand, the grain 59 has the hexagonal crystal structure, the C-plane of which is substantially parallel to the surfaces 54.

Figure 13B:
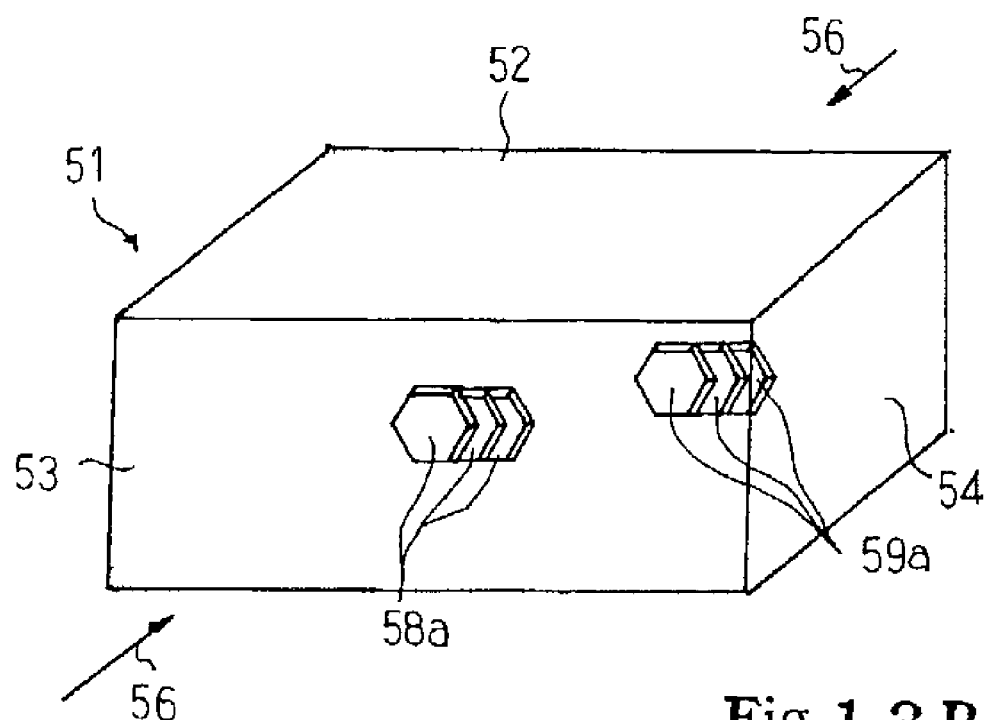
Figure 13C:
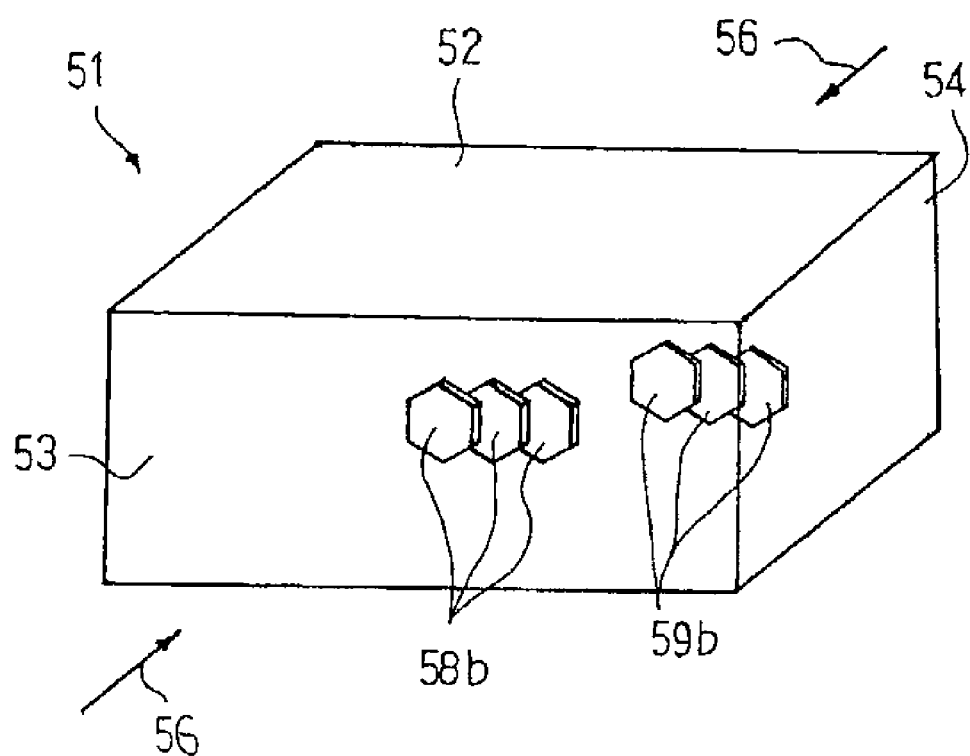
Figure 14C:
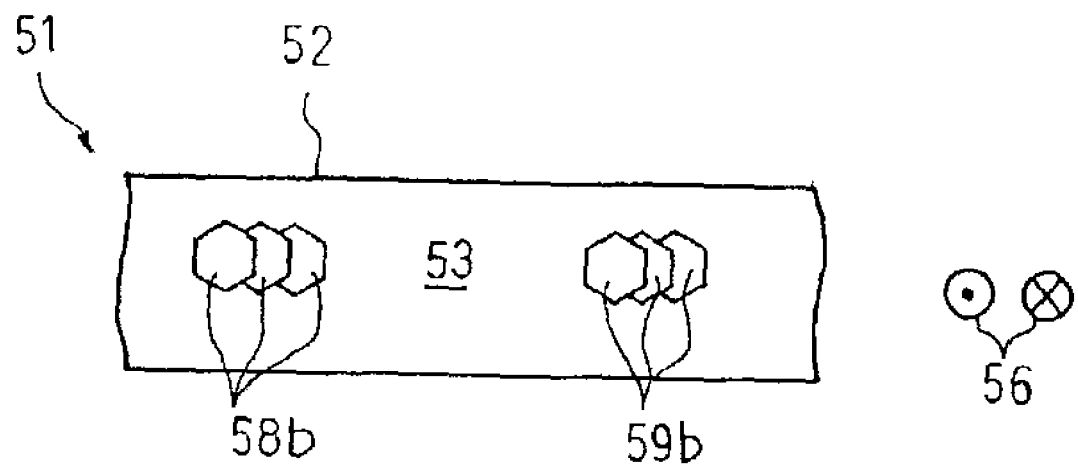
Figure 15C:
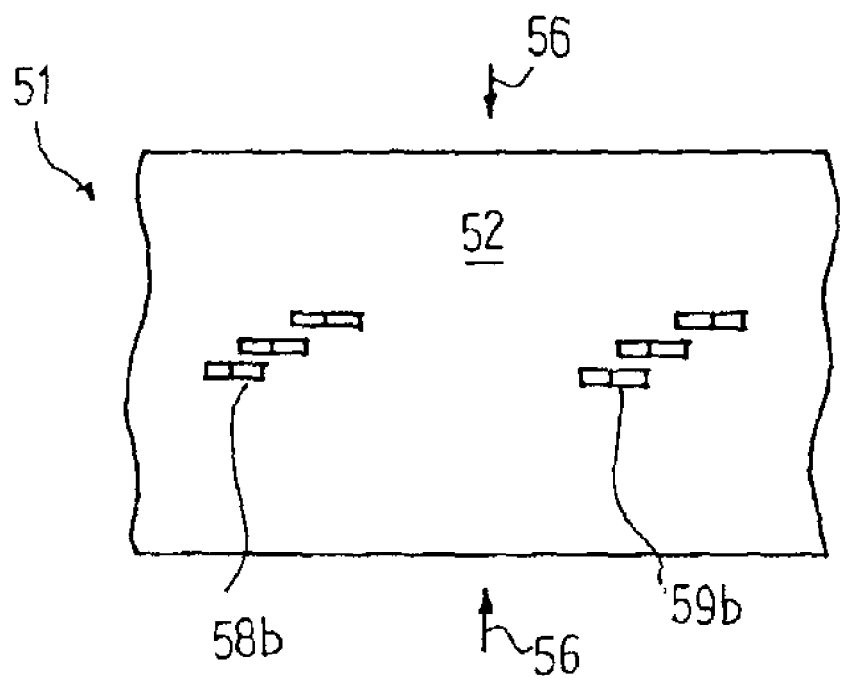

While the force is being exerted on the crystal grain 58 in the upset forging, the crystal grain 58 is rotated at 90 degrees about an axis parallel to X-axis, and is sliced in the direction parallel to Y-axis so that the crystal grain 58a keeps the C-plane in perpendicular to the arrow 56 (see FIGS. 13B, 14B and 15B). Otherwise, the crystal grain 58 is simply sliced in the direction parallel to the Y-axis without rotation so that the crystal grain 58b also keeps the C-plane in perpendicular to the arrow 56 (see FIGS. 13C, 14C and 15C).

On the other hand, while the force is being exerted on the crystal grain 59 in the upset forging, the crystal grain 59 is twisted, and is sliced in the direction parallel to the Y-axis so that the crystal grain 59a has the C-plane perpendicular to the arrow 56 (see FIGS. 13B, 14B and 15B). Otherwise, the crystal grain 59 is rotated at 90 degrees in a direction parallel to the X-axis, and is sliced in the direction parallel to the Y-axis so that the crystal grain 59b has the C-plane perpendicular to the arrow 56 (see FIGS. 13C, 14C and 15C).

Thus, the hexagonal surfaces, i.e., C-planes are in parallel to the direction 57, i.e., the direction in which the sintered product 51 protrudes. Although the C-planes of the crystal grain 58 and the C-planes of the crystal grain 59 were in parallel to the surfaces 53 and surfaces 54, respectively, before the upset forging, all the C-planes and, accordingly, all the a-axes are directed in parallel to the direction 57 after the upset forging. This results in that all the a-axes are uniformly directed in parallel to the direction 57. Thus, thermoelectric material is produced from the sintered product through the upset forging.

Electrodes

The electrodes are formed on pieces of thermoelectric material, and thermoelectric elements are completed. The electrodes are spaced from each other in the direction of the a-axes. The electric resistivity ρ low in the direction of a-axes. When a potential difference is applied between the electrodes, electric current flows through the piece of thermoelectric material, and the thermoelectric element exhibits a low resistance against the electric current. This results in a large figure of merit Z.

The thermoelectric elements are of the type having the p-type semiconductor and of the type having the n-type semiconductor, and the n-type thermoelectric elements and p-type thermoelectric elements are assembled into a Peltier element. The Peltier element may be used in a package of an optical communication module. Since the thermoelectric elements exhibit the large figure of merit Z, the Peltier element merely generates a small amount of Joule heat in the package. Thus, the low-power consumption Peltier element is obtained by using the thermoelectric material according to the present invention.

In the above-described process, the a-axes are oriented in the direction in which the sintered product protrudes through the upset forging. Therefore, the upset forging is corresponding to the step for orienting the a-axes to a predetermined direction. Any crystal axis orientation techniques are available for the process according to the present invention.

Evaluation

The present inventors produced samples 1, 2, 3, 4, 5 and 6 of thermoelectric material, and evaluated these samples. The composition of samples 1 to 6 was described in Table 1.

TABLE 1

| Sample | Composition | Conductivity Type |
|---|---|---|
| 1 | $Bi_{0.4}Sb_{1.6}Te_3$ | P |
| 2 | $Bi_{0.45}Sb_{1.55}Te_3$ | P |
| 3 | $Bi_{0.4}Sb_{1.6}Te_3$ plus 1 mass % of Te | P |
| 4 | $Bi_2Te_{2.85}Se_{0.15}$ plus 0.06 mass % of $SbI_3$ | N |
| 5 | $Bi_{1.9}Sb_{0.1}Te_{2.6}Se_{0.4}$ | N |
| 6 | $Bi_{1.9}Sb_{0.1}Te_{2.7}Se_{0.3}$ | N |

The present inventors blended the constituent elements, and sealed the mixture in ampuls. The mixture was melted in the ampuls, and the melted alloy was cooled. Then, six ingots were obtained from the pellets of samples 1 to 6. Using the liquid quenching facility shown in FIG. 6, the present inventors formed flakes through the liquid quenching. The flakes produced from samples 1 to 6 were referred to as "flakes 1, flakes 2, . . . . and flakes 6", respectively. The present inventors divide the flakes 1 to 6 into two groups, i.e., the flakes 1-1 to 6-1 and flakes 1-2 to 6-2.

Subsequently, the present inventors reduced the flakes 1-1 to 6-1 in hydrogen atmosphere. However, the other flakes 1-2 to 6-2 were not subjected to the reduction in hydrogen. The present inventors regulated the temperature and time period to 400 degrees in centigrade and 10 hours for the reduction in hydrogen.

After the reduction in hydrogen, the present inventors broke large flakes 1-1 to 6-1 and 1-2 to 6-2 into flakelets, and the flakes/flakelets 1-1 to 6-1 and 1-2 to 6-2 were hot pressed at 0.5 ton/cm² in argon atmosphere. Carbide dies were used for the hot pressing. The p-type flakes/flakelets 1-1/1-2, 2-1/2-2 and 3-1/3-2 were hot pressed at 380 degrees in centigrade for an hour, and the n-type flakes/flakelets 4-1/4-2, 5-1/5-1 and 6-1/6-2 were hot pressed at 450 degrees in centigrade for an hour. Then, sintered products 1-1 to 6-1 and 1-2 to 6-2 were formed from the flakes/flakelets 1-1 to 6-1 and 1-2 to 6-2 respectively. The sintered products were cubic, and measured 50 millimeters by 50 millimeters by 50 millimeters. The electric resistivity ρ and heat conductivity κ were measured for the sintered products 1-1 to 6-1 and 1-2 to 6-2, and Seebeck coefficient α and figure of merit Z were determined also for the sintered products 1-1 to 6-1 and 1-2 to 6-2. (See tables 2 and 3)

The sintered products 1-1 to 6-1 and 1-2 to 6-2 were subjected to the upset forging under the following conditions. Carbide dies were used. The pressurized surfaces, on which the force had been exerted in the hot pressing, were restricted, and the force was exerted on the surfaces perpendicular to the pressurized surfaces at 0.8 ton/cm² at 400 degrees in centigrade in a certain atmosphere for 5 hours. The oxygen concentration of the certain atmosphere was equal to or less than 5000 ppm, and the moisture concentration was equivalent to the dew point of −20 degrees in centigrade. The variance V was of the order of 55%. Upon completion of the upset forging, pieces of thermoelectric materials 1-1 to 6-1 and 1-2 to 6-2 were produced from the sintered products 1-1 to 6-1 and 1-2 to 6-2, respectively.

The present inventors measured the electric resistivity ρ and heat conductivity κ for the pieces of thermoelectric material 1-1 to 6-1 and 1-2 to 6-2, and Seebeck coefficient α and figure of merit Z were determined also for the sintered products 1-1 to 6-1 and 1-2 to 6-2 as shown in tables 2 and 3.

TABLE 2

| | After Primary Solidification | | | | Primary Solidification + Upset Forging | | | |
|---|---|---|---|---|---|---|---|---|
| | β | κ | ρ | Z | A | K | P | Z |
| SAMPle | (μ·V/K°) | (W/m·K°) | (×10⁻⁵ Ω·m) | (×10⁻³ 1/K°) | (μ·V/K°) | (W/m·K°) | (×10⁻⁵ Ω·m) | (×10⁻³ 1/K°) |
| 1-1 | 200 | 1.09 | 0.87 | 4.22 | 204 | 1.19 | 0.82 | 4.26 |
| 2-1 | 211 | 1.05 | 0.99 | 4.28 | 209 | 1.12 | 0.92 | 4.24 |

TABLE 2-continued

| SAMPle | After Primary Solidification | | | | Primary Solidification + Upset Forging | | | |
|---|---|---|---|---|---|---|---|---|
| | β (μ·V/K°) | κ (W/m·K°) | ρ (×10⁻⁵ Ω·m) | Z (×10⁻³ 1/K°) | A (μ·V/K°) | K (W/m·K°) | P (×10⁻⁵ Ω·m) | Z (×10⁻³ 1/K°) |
| 3-1 | 195 | 1.1 | 0.82 | 4.22 | 196 | 1.16 | 0.78 | 4.25 |
| 4-1 | −216 | 0.99 | 1.11 | 4.25 | −217 | 1.07 | 1.03 | 4.27 |
| 5-1 | −193 | 1.02 | 0.86 | 4.25 | −195 | 1.11 | 0.81 | 4.23 |
| 6-1 | −201 | 0.97 | 0.99 | 4.21 | −201 | 1.04 | 0.92 | 4.22 |

TABLE 3

| SAMPle | After Primary Solidification | | | | Primary Solidification + Upset Forging | | | |
|---|---|---|---|---|---|---|---|---|
| | α (μ·V/K°) | κ (W/m·K°) | ρ (×10⁻⁵ Ω·m) | Z (×10⁻³ 1/K°) | A (μ·V/K°) | K (W/m·K°) | P (×10⁻⁵ Ω·m) | Z (×10⁻³ 1/K°) |
| 1-2 | 200 | 1.07 | 0.89 | 4.20 | 203 | 1.15 | 0.84 | 4.27 |
| 2-2 | 211 | 1.03 | 1.01 | 4.28 | 209 | 1.08 | 0.95 | 4.26 |
| 3-2 | 197 | 1.08 | 0.85 | 4.23 | 196 | 1.12 | 0.81 | 4.23 |
| 4-4 | −208 | 0.93 | 1.1 | 4.23 | −210 | 1.01 | 1.03 | 4.24 |
| 5-2 | −186 | 0.95 | 0.86 | 4.23 | −189 | 1.02 | 0.82 | 4.27 |
| 6-2 | −197 | 0.93 | 0.99 | 4.22 | −199 | 0.99 | 0.94 | 4.26 |

Comparing the thermoelectric materials 1-1 to 6-1 and 1-2 to 6-2 with the sintered products 1-1 to 6-1 and 1-2 to 6-2, it is understood that the electric resistivity ρ was smaller in the pieces of thermoelectric material than that in the sintered products without reduction of the figure of merit Z. This is because of the fact that the orientation of the a-axes of the crystal grains was enhanced through the upset forging. The electric resistivity is inversely proportional to the ratio of the crystal grains with the a-axes uniformly oriented to all the crystal grains consisting of the thermoelectric material. This means that the ratio is expressed by the electric resistivity. Tables 2 and 3 teach that the ratio of crystal grains with the well-oriented grains to all the grains consisting of the thermoelectric material is to be equivalent to equal to or less than $1.03 \times 10^5$ Ω·m. The thermoelectric material with the small electric resistivity ρ does not generate a large amount of Joule heat so that the user can employ the thermoelectric material according to the present invention in applications where high temperature ambience is created.

The present inventors investigated the orientation of the crystal grains with an electron backscatter diffraction method, i.e., EBSD. Samples of a certain group, in which samples 1-1 to 6-1 and 1-2 to 6-2 were included, were radiated with electron beam. The electron beams was diffracted at the crystal lattice, and the diffracted image was taken with a CCD (Charge Coupled Device) camera. The present inventors analyzed the images, and determined the orientation of the crystal grains.

Figure 17A:
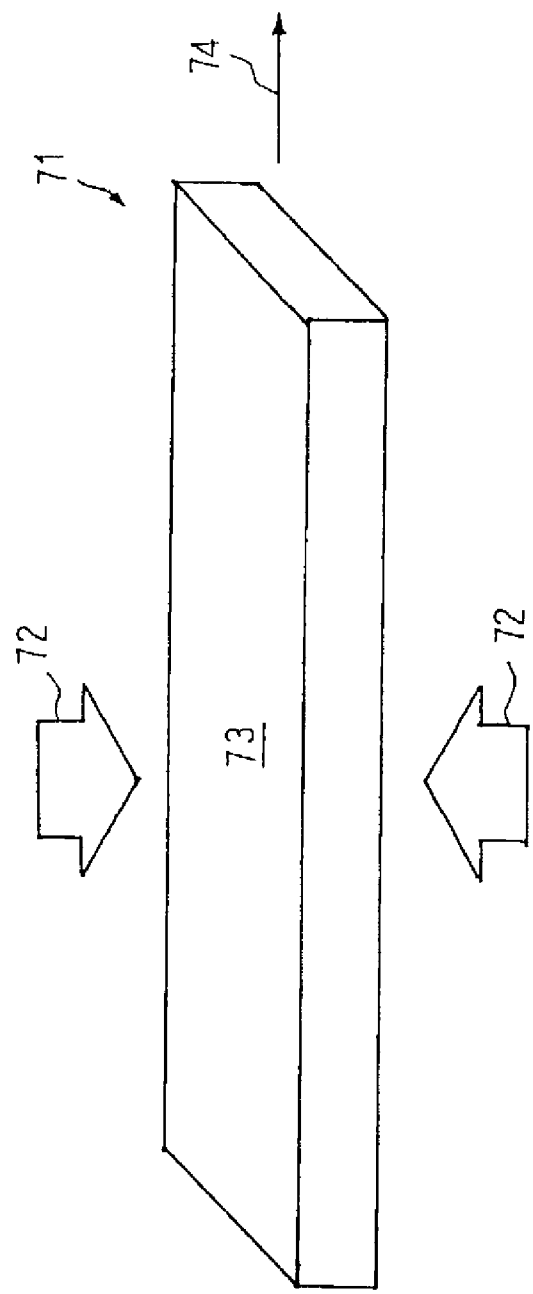
FIG. 17A is a perspective view showing a sample to be analyzed for the crystal orientation.
Figure 17B:
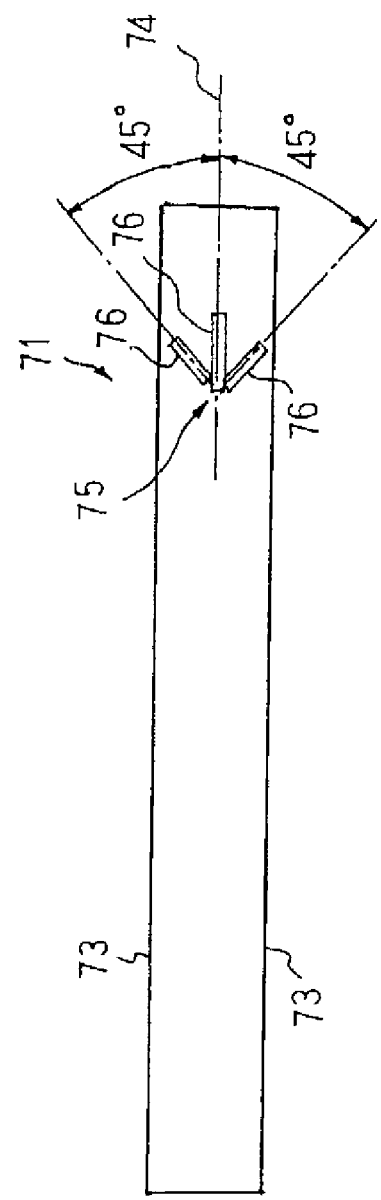
FIG. 17B is a side view showing the crystal grains in the sample.

FIGS. 17A and 17B show a sample 71 investigated through the electron backscatter diffraction method. Force 72 was exerted on the surfaces 73 of the sample 71 in the upset forging, and the sample 71 protruded in a direction 74. The sample 71 contained crystal grains 75, the C-planes 76 of which inclined with respect to the direction 74 at 45 degrees or less. The C-planes of the other crystal grains inclined to the direction at more than 45 degrees. The crystal grains 75 occupied an area of the surface 73, and the ratio of the area to the entire area of the surface 73 was equal to or greater than 90%.

The ratio was measured on the sintered products 1-1 to 6-1 and 1-2 to 6-2 and the pieces of thermoelectric material 1-1 to 6-1 and 1-2 to 6-2 as shown in tables 4 and 5.

TABLE 4

| | Ratio of Area (%) | |
|---|---|---|
| Sample | After Primary Solidification | Primary Solidification + Upset Forging |
| 1-1 | 68 | 97 |
| 2-1 | 67 | 93 |
| 3-1 | 73 | 96 |
| 4-1 | 68 | 94 |
| 5-1 | 75 | 97 |
| 6-1 | 65 | 93 |

TABLE 5

| | Ratio of Area (%) | |
|---|---|---|
| Sample | After Primary Solidification | Primary Solidification + Upset Forging |
| 1-2 | 69 | 96 |
| 2-2 | 63 | 94 |
| 3-2 | 69 | 94 |
| 4-2 | 62 | 94 |
| 5-2 | 68 | 95 |
| 6-2 | 63 | 93 |

Comparing the ratio of the sintered products with the ratio of the pieces of thermoelectric material, it is understood that the ratio was drastically increased through the upset forging. Thus, the thermoelectric material was improved in the electric resistivity ρ without reduction of the figure of merit Z by virtue of the well-oriented crystal grains oriented through the two-step force-exertion. Although the ratio of 93% was achieved in samples 2-1, 6-1 and 6-2, the present inventors confirmed the minimum ratio of 90% in another sample.

Although particular embodiments of the present invention have been shown and described, it will be apparent to those skilled in the art that various changes and modifications may be made without departing from the spirit and scope of the present invention.

In the above-described embodiment, the melted alloy is solidified through the single roll process. However, a gas atomizing process is available for the liquid quenching.

The upset forging is not the only technique for orienting the a-axes. A high pressure torsion is available for the orientation of a-axes.

The invention claimed is:

1. A process for producing thermoelectric material, comprising the steps of:
   a) preparing a liquid raw material for said thermoelectric material;
   b) quenching said liquid raw material for producing flakes containing crystal grains;
   c) orienting C-planes of said crystal grains of a crystal structure in a hexagonal system in parallel to a certain direction through a primary solidification to obtain a solid body, wherein said primary solidification is carried out by exerting a first force on said flakes in a first-force-exerting direction parallel to said certain direction;
   d) after step c), orienting a-axes on said C-planes in parallel to a target direction perpendicular to said certain direction for producing said thermoelectric material by exerting a second force on said solid body in a second force-exerting direction perpendicular to said first force-exerting direction; and
   e) forming electrodes on a piece of said thermoelectric material in such a manner that said electrodes are spaced from one another in said target direction.

2. The process as set forth in claim 1, in which said step a) includes the sub-steps of
   a-1) preparing an ingot, and
   a-2) melting said ingot for producing said liquid raw material in an inert atmosphere.

3. The process as set forth in claim 1, in which said liquid raw material is poured onto a rotating roller so that said crystal grains are grown in said certain direction parallel to a radial direction of said rotating roller.

4. The process as set forth in claim 3, in which said primary solidification is carried out by exerting a force on a lamination of said flakes in a force-exerting direction parallel to the direction in which said crystal grains are grown so that said C-planes are oriented in said certain direction parallel to said force-exerting direction.

5. The process as set forth in claim 4, in which said force is exerted on said lamination of said flakes through a hot pressing.

6. The process as set forth in claim 4, in which said force is exerted on said lamination of said flakes through an extrusion.

7. The process as set forth in claim 3, in which said primary solidification is carried out by exerting a first force on a lamination of said flakes in a first force-exerting direction parallel to the direction in which said crystal grains are grown so that said C-planes are oriented in said certain direction parallel to said first force-exerting direction, and a second force is exerted on a solid body obtained through said step c) in a second force-exerting direction perpendicular to said first force-exerting direction so that said a-axes are oriented in said target direction normal to a virtual plane defined by said first and second force-exerting directions.

8. The process as set forth in claim 7, in which said second force is exerted on said solid body through an upset forging.

9. The process as set forth in claim 7, in which said first force is exerted on said crystal grains through a hot pressing, and said second force is exerted on said solid body through an upset forging.

10. The process as set forth in claim 1, further comprising the step f) of curing chilled grains in surface portions of said flakes between said step b) and said step c).

11. The process as set forth in claim 10, in which said chilled grains are cured through a reduction in hydrogen atmosphere.

12. The process as set forth in claim 10, in which said chilled grains are cured through an annealing in inert atmosphere.

* * * * *